US010381523B2

United States Patent
Liu et al.

(10) Patent No.: US 10,381,523 B2
(45) Date of Patent: Aug. 13, 2019

(54) PACKAGE FOR ULTRAVIOLET EMITTING DEVICES

(71) Applicant: RayVio Corporation, Hayward, CA (US)

(72) Inventors: Saijin Liu, Hayward, CA (US); Douglas A. Collins, Hayward, CA (US)

(73) Assignee: RayVio Corporation, Hayward, CA (US)

( * ) Notice: Subject to any disclaimer, the term of this patent is extended or adjusted under 35 U.S.C. 154(b) by 0 days.

(21) Appl. No.: 14/984,862

(22) Filed: Dec. 30, 2015

(65) Prior Publication Data

US 2017/0194533 A1    Jul. 6, 2017

(51) Int. Cl.
| H01L 33/48 | (2010.01) |
| H05K 1/11 | (2006.01) |
| H05K 1/02 | (2006.01) |
| H01L 33/62 | (2010.01) |
| H01L 33/60 | (2010.01) |
| H01L 33/64 | (2010.01) |

(52) U.S. Cl.
CPC .......... H01L 33/486 (2013.01); H01L 33/642 (2013.01); H05K 1/021 (2013.01); H01L 2224/73265 (2013.01); H05K 2201/066 (2013.01); H05K 2201/10106 (2013.01)

(58) Field of Classification Search
CPC ....... H01L 33/486; H01L 33/60; H01L 33/62; H01L 33/642; H05K 1/0201; H05K 1/111; H05K 2201/066; H05K 2201/10106
USPC .......................................................... 257/98
See application file for complete search history.

(56) References Cited

U.S. PATENT DOCUMENTS

| 2005/0077531 A1* | 4/2005 | Kim ...................... H01L 33/505 |
| | | 257/98 |
| 2008/0043444 A1* | 2/2008 | Hasegawa ............ H01L 33/642 |
| | | 361/717 |
| 2008/0130308 A1* | 6/2008 | Behr ........................ F21K 9/00 |
| | | 362/507 |
| 2009/0236729 A1* | 9/2009 | Fann ...................... C22C 12/00 |
| | | 257/692 |
| 2011/0062469 A1* | 3/2011 | Camras ................... H01L 33/58 |
| | | 257/98 |
| 2011/0127912 A1* | 6/2011 | Lee ...................... F21S 48/1159 |
| | | 315/32 |
| 2011/0220867 A1* | 9/2011 | Khan ................ H01L 21/02458 |
| | | 257/13 |
| 2012/0039064 A1* | 2/2012 | Ooyabu ................ H01L 33/507 |
| | | 362/84 |
| 2013/0049564 A1* | 2/2013 | Jung ................... H01S 5/02469 |
| | | 313/45 |

* cited by examiner

Primary Examiner — Tong-Ho Kim
(74) Attorney, Agent, or Firm — Patent Law Group LLP; Brian D. Ogonowsky

(57) ABSTRACT

Embodiments of the invention include a light emitting diode (LED) including a semiconductor structure. The semiconductor structure includes an active layer disposed between an n-type region and a p-type region. The active layer emits UV radiation. The LED is disposed on the mount. The mount is disposed on a conductive slug. A support surrounds the conductive slug. The support includes electrically conductive contact pads disposed on a bottom surface, and a thermally conductive pad disposed beneath the conductive slug, wherein the thermally conductive pad is not electrically connected to the LED.

20 Claims, 3 Drawing Sheets

PACKAGE FOR ULTRAVIOLET EMITTING DEVICES

BACKGROUND

Description of Related Art

The bandgap of III-nitride materials, including (Al, Ga, In)—N and their alloys, extends from the very narrow gap of InN (0.7 eV) to the very wide gap of AlN (6.2 eV), making III-nitride materials highly suitable for optoelectronic applications such as light emitting diodes (LEDs), laser diodes, optical modulators, and detectors over a wide spectral range extending from the near infrared to the deep ultraviolet. Visible light LEDs and lasers can be obtained using InGaN in the active layers, while ultraviolet (UV) LEDs and lasers require the larger bandgap of AlGaN.

UV LEDs with emission wavelengths in the range of 230-350 nm are expected to find a wide range of applications, most of which are based on the interaction between UV radiation and biological material. Typical applications include surface sterilization, water purification, medical devices and biochemistry, light sources for ultra-high density optical recording, white lighting, fluorescence analysis, sensing, and zero-emission automobiles.

DETAILED DESCRIPTION

Though the devices described herein are III-nitride devices, devices formed from other materials such as other III-V materials, II-VI materials, Si are within the scope of embodiments of the invention. The devices described herein may be configured to emit visible, UV A (peak wavelength between 340 and 400 nm), UV B (peak wavelength between 290 and 340 nm), or UV C (peak wavelength between 210 and 290 nm) radiation.

In embodiments of the invention, efficient packages for UV-emitting devices are described. In some embodiments, the packages are used with flip chip UVLEDs.

Figure 1A:
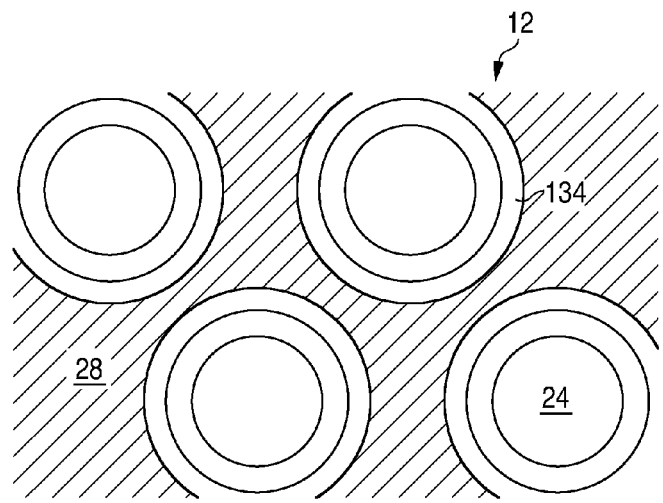
FIG. 1A is a plan view of multiple pixels in a flip chip UV-emitting device (UVLED).
Figure 1B:
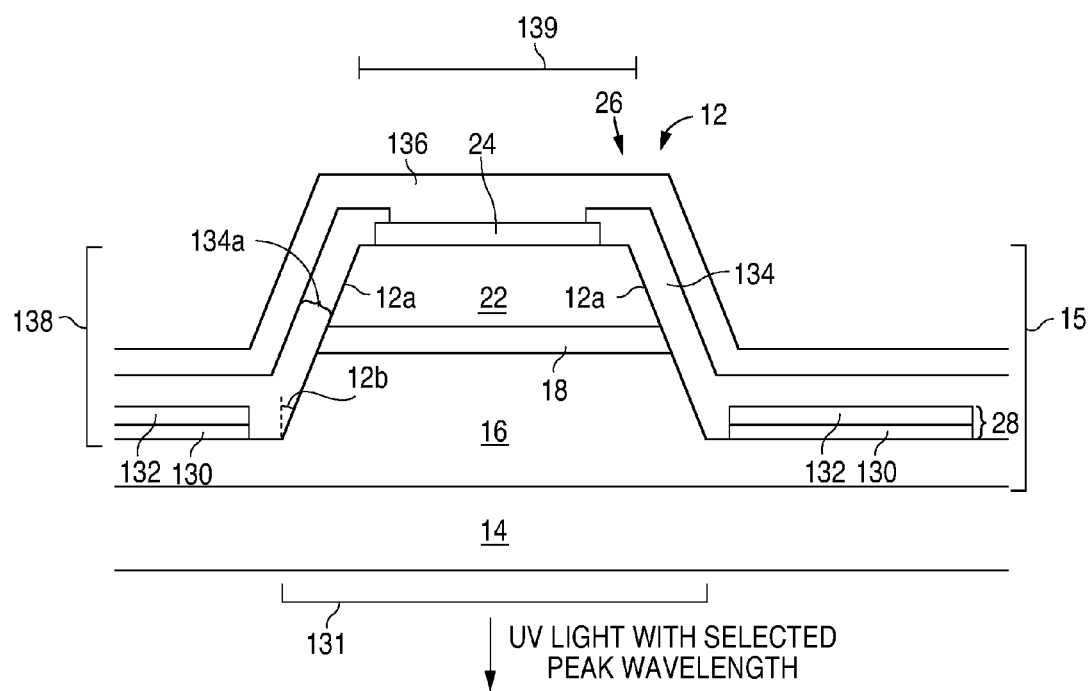
FIG. 1B is a cross sectional view of one pixel in the UVLED.

Commercially available UVA, UVB, and UVC LEDs may be used in the various embodiments. FIGS. 1A and 1B are examples of the assignee's own UVB and UVC LEDs that may be used. FIG. 1A is a top down view of a portion of an array of UVLED pixels 12, and FIG. 1B is a bisected cross-section of a single UVLED pixel 12. Any suitable UVLED may be used and embodiments of the invention are not limited to the device of FIGS. 1A and 1B.

The UVLEDs are typically III-nitride, and commonly GaN, AlGaN, and InGaN. The array of UV emitting pixels 12 is formed on a single substrate 14, such as a transparent sapphire substrate. Other substrates are possible. Although the example shows the pixels 12 being round, they may have any shape, such as square. The light escapes through the transparent substrate, as shown in FIG. 1B. The pixels 12 may each be flip-chips, where the anode and cathode electrodes face the mount (described below).

All semiconductor layers are epitaxially grown over the substrate 14. An AlN or other suitable buffer layer (not shown) is grown, followed by an n-type region 16. The n-type region 16 may include multiple layers of different compositions, dopant concentrations, and thicknesses. The n-type region 16 may include at least one $Al_aGa_{1-a}N$ film doped n-type with Si, Ge and/or other suitable n-type dopants. The n-type region 16 may have a thickness from about 100 nm to about 10 microns and is grown directly on the buffer layer(s). The doping level of Si in the n-type region 16 may range from $1\times10^{16}$ cm$^{-3}$ to $1\times10^{21}$ cm$^{-3}$. Depending on the intended emission wavelength, the AlN mole fraction "a" in the formula may vary from 0% for devices emitting at 360 nm to 100% for devices designed to emit at 200 nm.

An active region 18 is grown over the n-type region 16. The active region 18 may include either a single quantum well or multiple quantum wells (MQWs) separated by barrier layers. The quantum well and barrier layers contain $Al_xGa_{1-x}N/Al_yGa_{1-y}N$, wherein 0<x<y<1, x represents the AlN mole fraction of a quantum well layer, and y represents the AlN mole fraction of a barrier layer. The peak wavelength emitted by a UV LED is generally dependent upon the relative content of Al in the AlGaN quantum well active layer.

A p-type region 22 is grown over the active region 18. Like the n-type region 16, the p-type region 22 may include multiple layers of different compositions, dopant concentrations, and thicknesses. The p-type region 22 includes one or more p-type doped (e.g. Mg-doped) AlGaN layers. The AlN mole fraction can range from 0 to 100%, and the thickness of this layer or multilayer can range from about 2 nm to about 100 nm (single layer) or to about 500 nm (multilayer). A multilayer used in this region can improve lateral conductivity. The Mg doping level may vary from $1\times10^{16}$ cm$^{-3}$ to $1\times10^{21}$ cm$^{-3}$. A Mg-doped GaN contact layer may be grown last in the p-type region 22.

All or some of the semiconductor layers described above may be grown under excess Ga conditions, as described in more detail in US 2014/0103289, which is incorporated herein by reference.

The semiconductor structure 15 is etched to form trenches between the pixels 12 that reveal a surface of the n-type region 16. The sidewalls 12a of the pixels 12 may be vertical or sloped with an acute angle 12b relative to a normal to a major surface of the growth substrate. The height 138 of each pixel 12 may be between 0.1-5 microns. The widths 131 and 139 at the bottom and top of each pixel 12 may be at least 5 microns. Other dimensions may also be used.

Before or after etching the semiconductor structure 15 to form the trenches, a metal p-contact 24 is deposited and patterned on the top of each pixel 12. The p-contact 24 may include one or more metal layers that form an ohmic contact, and one or more metal layers that form a reflector. One example of a suitable p-contact 24 includes a Ni/Ag/Ti multi-layer contact.

An n-contact 28 is deposited and patterned, such that n-contact 28 is disposed on the substantially flat surface of the n-type region 16 between the pixels 12. The n-contact 28 may include a single or multiple metal layers. The n-contact 28 may include, for example, an ohmic n-contact 130 in direct contact with the n-type region 16, and an n-trace metal layer 132 formed over the ohmic n-contact 130. The ohmic n-contact 130 may be, for example, a V/Al/Ti multi-layer contact. The n-trace metal 132 may be, for example, a Ti/Au/Ti multi-layer contact.

The n-contact 28 and the p-contact 24 are electrically isolated by a dielectric layer 134. Dielectric layer 134 may be any suitable material such as, for example, one or more oxides of silicon, and/or one or more nitrides of silicon, formed by any suitable method. Dielectric layer 134 covers n-contact 28. Openings formed in dielectric layer 134 expose p-contact 24.

A p-trace metal 136 is formed over the top surface of the device, and substantially conformally covers the entire top surface. The p-trace metal 136 electrically connects to the p-contact 24 in the openings formed in dielectric layer 134. The p-trace metal 136 is electrically isolated from n-contact 28 by dielectric layer 134.

Robust metal pads electrically connected to the p-trace metal 136 and n-contact 28 are provided outside of the drawing for connection to the mount. Multiple pixels 12 are included in a single UVLED. The pixels are electrically connected by large area p-trace metal 136 and the large area n-trace metal 132. The number of pixels may be selected based on the application and/or desired radiation output. A single UVLED, which includes multiple pixels, is illustrated in the following figures as UVLED 1.

In some embodiments, substrate 14 is sapphire. Substrate 14 may be, for example, on the order of hundred of microns thick. Substrate 14 may remain part of the device in some embodiments, and may be removed from the semiconductor structure in some embodiments.

The UVLED may be square, rectangular, or any other suitable shape when viewed from the top surface of substrate 14, when the device is flipped relative to the orientation illustrated in FIG. 1B.

Figure 2:
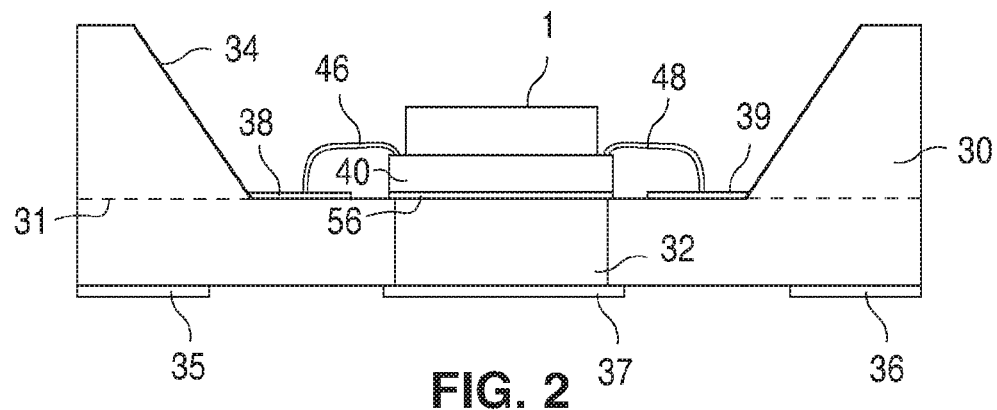
FIG. 2 is a cross sectional view of a packaged UVLED including a mount and a support.

FIG. 2 illustrates a UVLED 1 disposed in a package. UVLED 1 is electrically and physically attached to a mount 40, described below in more detail in the text accompanying FIG. 3. The UVLED 1 and mount 40 are attached to a support 30.

The support 30 may be shaped as a reflector cup as illustrated in FIG. 2, such that the top surface of the support is above the top surface of UVLED 1. Sidewalls 34 of support 30 that form the reflector cup may be in the shape of, for example, a truncated inverted cone, or a truncated inverted pyramid. Sidewalls 34 may be formed from a UV-reflective material, or coated with a UV-reflective material. In some embodiments, the reflector cup portion of support 30 is formed separately and/or formed of a different material from the bottom portion of support 30, as indicated by dashed line 31 in FIG. 2. In FIG. 2, support 30 is shaped as a reflector cup, though this is not required. Support 30 may be any suitable shape. In some embodiments, support 30 does not have sidewalls 34 as illustrated in FIG. 2. In some embodiments, the top surface of support 30 is below the top surface of UVLED 1.

The support 30 includes a highly thermally conductive slug 32 disposed directly beneath the mount 40 on which UVLED 1 is disposed. The slug may be any suitable material, including, for example, metal, alloy, silver, copper, or CuW. The slug may be interference fit, glued, or secured in any other suitable way in an opening formed in the support 30. Support 30 may be molded or otherwise formed around slug 32 in some embodiments. In one embodiment, support 30 is formed by a low temperature co-fire ceramic process, as is known in the art.

The mount 40 on which the UVLED 1 is mounted is positioned over and attached to the slug 32. The mount 40 and slug 32 may be connected by a thermally conductive adhesive layer 56. Adhesive layer 56 may be any suitable material including, for example, lead-free solder pastes, such as SAC, AuSn, SnBi, InSn, etc, sintering silver, silver epoxy, or any other suitable material.

Figure 3:
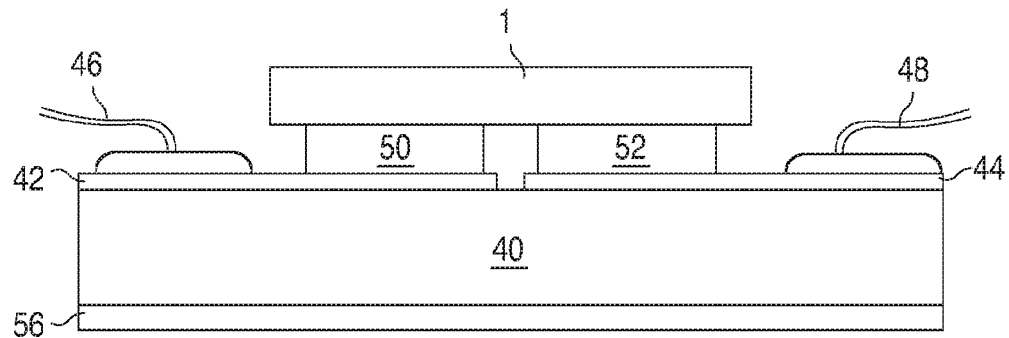
FIG. 3 is a cross sectional view of a UVLED disposed on a mount.

The UVLED 1 and mount 40 are illustrated in more detail in FIG. 3. Mount 40 may be any suitable material that is highly thermally conductive (for example, with a thermal conductivity of at least 170 W/mK in some embodiments), highly electrically insulating, and mechanically rigid (for example, with a coefficient of thermal expansion that matches or is close to that of UVLED 1). In some embodiments, the mount 40 is designed such that the junction temperature of UVLED 1 does not exceed 40° C. Examples of suitable materials for mount 40 include but are not limited to ceramic, diamond, AlN, beryllium oxide, silicon or electrically conductive material such as silicon, metal, alloy, Al, or Cu, provided the electrically conductive material is appropriately coated with an insulating layer such as silicon oxide, silicon nitride or aluminum oxide, or any other suitable material. A UV-reflective coating may be formed on any part of the mount 40 that may "see" radiation emitted by the UVLED.

In some embodiments, circuitry and/or other structures such as transient voltage suppression circuitry, driver circuitry, or any other suitable circuitry may be disposed within mount 40, or mounted on a surface of mount 40, such that the circuitry or other structures are electrically connected to UVLED 1, if necessary.

UVLED 1 is electrically and mechanically connected to mount 40 via interconnects 50 and 52. One of interconnects 50 and 52 is electrically connected to n-contact 28; the other of interconnects 50 and 52 is electrically connected to large area p-trace metal 136 (n-contact 28 and large area p-trace metal 136 are illustrated in FIGS. 1A and 1B). Interconnects 50 and 52 may be solder, metal interconnects, or any other suitable electrically conductive and mechanically robust connection. Interconnects 50 and 52 are electrically and mechanically connected to contact pads 42 and 44 on the top surface of mount 40.

Wire bonds 46 and 48 electrically connect contact pads 42 and 44 to top contact pads 38 and 39, disposed on a top surface of support 30, as illustrated in FIG. 2. In some embodiments, as illustrated in FIG. 3, wire bonds 46 and 48 are formed such that the maximum height of the wires is lower than the top surface of UVLED 1. Though wire bonds are illustrated in FIGS. 2 and 3, any other suitable electrical connection may be used, such as surface-mount conductive traces formed on a surface of or within the mount 40. In some embodiments, circuitry (such as, for example, contact pads 42 and 44) is available on the top surface of mount 40 only. There are no electrical components on the bottom surface of mount 40. The entire bottom surface of mount 40 is available as a thermal path (as illustrated in FIGS. 2 and 3), for example to conduct heat away from UVLED 1. The thermal path involves no electrical connection to the UVLED. In some embodiments, conductive vias are formed in an outer region of the bottom surface of mount 40, leaving the center of the bottom surface of the mount 40 available as a thermal path. For example, the center thermal path may be at least 80% of the bottom surface of the mount in some embodiments, and at least 90% of the bottom surface of the mount in some embodiments.

Returning to FIG. 2, top contact pads 38 and 39 on the top surface of support 30 are electrically connected to bottom contact pads 35 and 36, for example through conductive vias formed within support 30. Interconnect 50 (FIG. 3), contact pad 42 (FIG. 3), wire bond 46, top contact pad 38, and bottom contact pad 35 provide an electrical path to one of the n-type region and the p-type region in UVLED 1. Interconnect 52 (FIG. 3), contact pad 44 (FIG. 3), wire bond 48, top contact pad 39, and bottom contact pad 36 provide an electrical path to the other of the n-type region and the p-type region in UVLED 1.

An electrically neutral, thermally conductive center pad 37 is disposed on the bottom of support 30, in thermal contact with slug 32. In some embodiments, a separate pad is omitted, and the bottom surface of slug 32 functions as an electrically neutral center pad. Interconnects 50 and 52, contact pads 42 and 44, mount 40, adhesive 56, and thermally conductive slug 32 form a thermal path that may conduct heat away from UVLED 1.

In some embodiments, a UV reflective coating is formed on portions of the top surface of support 30 (i.e., the bottom of the reflector cup formed by sidewalls 34) that are not occupied by mount 40. Mount 40 may be, for example, at least 200 µm thick in some embodiments and no more than 300 µm thick in some embodiments, which allows a reflective coating to be formed that is sufficiently thick for optimal scattering (as described below) and that does not touch UVLED 1. Examples of suitable reflective coatings include, for example, reflective and/or high index particles such as $Al_2O_3$, Teflon, Al, or $TiO_2$ ($TiO_2$ is absorbing of UVC light and may therefore be unsuitable for UVC applications) disposed in silicone or any other suitable matrix that is low index, UV-resistant, transparent to light between for example 250 nm and 350 nm, and electrically insulating. In some embodiments, the difference in refractive index between the particles and the matrix causes scattering of light incident on the reflective coating layer. For example, commercially available UV-suitable silicone (such as, for example, Schott UV-200) may have a refractive index of no more than 1.42. $Al_2O_3$ particles may have a refractive index of 1.8. The difference between 1.42 and 1.8 may cause suitable scattering. The particles may be micron sized or nanometer sized. The reflective coating may be formed by dispensing, molding, or any other suitable process.

Support 30 may be any material that is suitable for interference-fitting or otherwise attaching slug 32, suitable for forming embedded electrical paths connecting top contact pads 38 and 39 with bottom contact pads 35 and 36, mechanically and chemically robust, reliable, and UV-reflective in some embodiments. Support 30 may be, for example, ceramic, aluminum oxide, aluminum nitride, or any other suitable material. In one embodiment, support 30 is silicone molding compound (SMC) or epoxy molding compound (EMC) with metal alloy pads.

Figure 5:
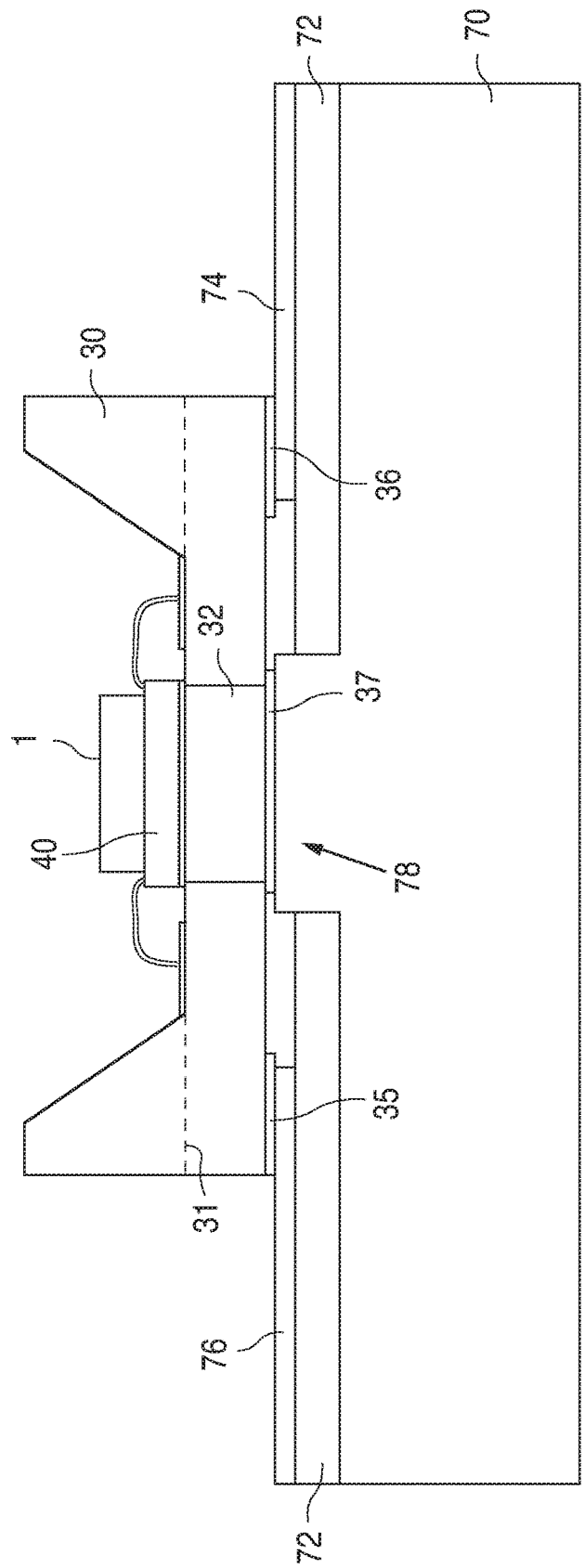
FIG. 5 is a cross sectional view of a packaged UVLED disposed on a structure such as a circuit board.

Bottom electrical contact pads 35 and 36 and thermal pad 37 may be used to attach the packaged UVLED to another structure, such as a metal-core printed circuit board or any other suitable structure. Suitable structures include an exposed thermal pad, for connecting to electrically-neutral thermal pad 37, as illustrated in FIG. 5. In the structure illustrated in FIG. 5, the structure 70, which may be, for example, a metal-core printed circuit board, includes an exposed thermal pad 78, to which thermal pad 37 is connected, and electrical pads 74 and 76, to which electrical contact pads 36 and 35 are connected. The electrical pads 74 and 76 are isolated from the thermal pad 78 by an insulating structure 72. The exposed thermal pad 78 may be an embedded Cu slug, AlN slug, or any other suitable structure. In a metal-core printed circuit board, the exposed thermal pad may also be the metal core itself with an opening for direct access. The metal core may be Cu or Al, or any other suitable material. The suitable structure 70 may then be mounted on a heat sink, to provide a thermal path to thermal pad 37.

Figure 4:
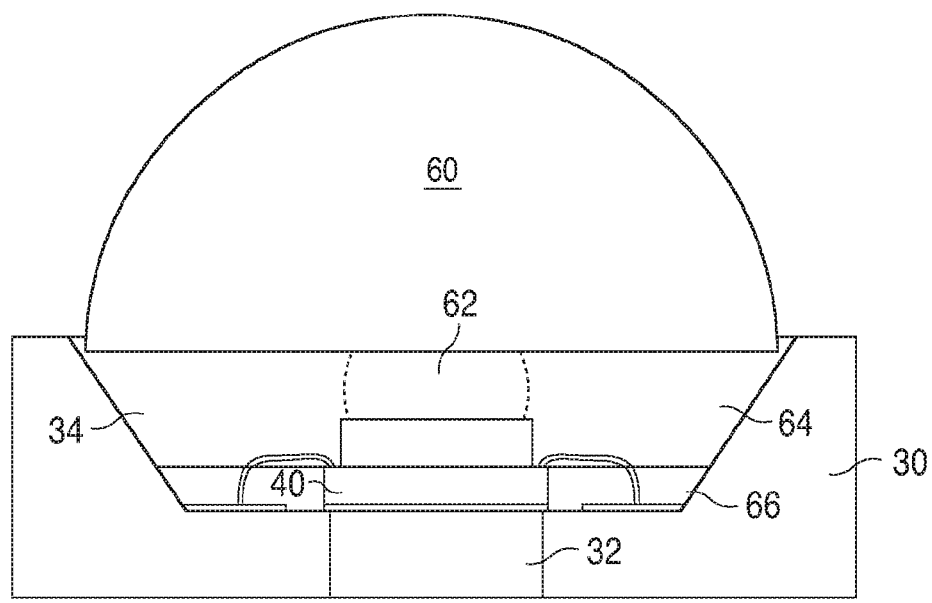
FIG. 4 is a cross sectional view of a packaged UVLED including an optic such as a lens.

FIG. 4 illustrates a device with an optic 60 such as a lens disposed over the UVLED 1. Though a dome lens is illustrated in FIG. 4, any suitable optic, such as a Fresnel lens, other lens, or other optic, may be used. In some embodiments, optic 60 is a solid material. In cross section, the optic 60 may be, for example, rotationally symmetric, oval, round, square, rectangular, triangular, or any other suitable shape. A dome lens may have a hemispherical, elliptical, or parabolic shape.

Optic 60 is formed from a material that is transparent to UV radiation at wavelengths emitted by active region 14, and able to withstand the UV radiation without degrading. For example, in some embodiments, the optic may be formed from a material that transmits at least 85% of UV radiation at 280 nm, when a typical height of the optic is ~2× the width of the UVLED 1. The transparency of the material may degrade no more than 1% after 1000 hrs of exposure to UV radiation at 280 nm. In some embodiments, optic 60 is formed from a material that is moldable, such as, for example, fused silica, glass, IHU UV transmissive glass available from Isuzu Glass, Inc., and UV-resistant silicone. In some embodiments, optic 60 is formed from a material that may be shaped by, for example, grinding and polishing, such as quartz or sapphire. An optic formed by molding may be less expensive; an optic formed by grinding and polishing may be of better optical quality.

In the device illustrated in FIG. 4, a reflective coating 66 as described above is disposed on the bottom surface of the support 30, in the area surrounding mount 40. The cavity between optic 60 and reflective coating 66, surrounding UVLED 1, is filled with an encapsulant material such as an epoxy or other suitable material to mechanically support the optic, a material with higher thermal conductivity than air to assist in heat transfer out of the UVLED 1, or a diffusion barrier to protect the UVLED 1 from the surrounding environment. The encapsulant material may mechanically connect the optic 60 to the structure, and may optically connect the optic 60 to UVLED 1. The encapsulant material may be any suitable material that is transparent, substantially non-degrading when exposed to UV light, and suitable as an adhesive. Examples include but are not limited to silicone. The thickness of encapsulant material 62 over UVLED 1 is 200 µm or less in some embodiments, 100 µm or less in some embodiments, and 50 µm or less in some embodiments.

In some embodiments, encapsulant material is disposed only in the area 62 between optic 60 and UVLED 1, such that area 64 is a substantially empty cavity. In some embodiments, a highly UV-transparent material such as silicone is disposed in area 62 between optic 60 and UVLED 1, and area 64 between optic 60 and reflective coating 66 is filled with a less expensive, less UV-transparent material such as a different silicone. In some embodiments, a single encapsulant material is disposed in both area 62 between optic 60 and UVLED 1, and area 64 between optic 60 and reflective coating 66.

In some embodiments, encapsulant material is disposed over UVLED 1, then optic 60 is pressed down on UVLED 1, to keep the encapsulant material in area 62 thin. In these embodiments, wire bonds 46 and 48, which may be damaged by the pressing, may be replaced with different electrical connections such as surface mountable vias, as described above.

In the embodiment illustrated in FIG. 4, optic 60 is supported only by encapsulant material. In some embodiments, optic 60 may be sized and shaped to rest on sloped sidewalls 34 or the top, flat surface of support 30 outside of sloped sidewalls 34, or may include one or more tabs which may rest on the top surface of support 30 outside of sloped sidewalls 34, or in notches formed in sloped sidewalls 34. Optic 60 may thus be mechanically supported by support 30. An adhesive material may be disposed between the optic 60 and support 30, or between tabs formed on or attached to the optic and support 30. Examples of suitable adhesive materials include silicone.

In some embodiments, a coating is disposed on the sides of UVLED 1. In some embodiments, if the optic is only optically coupled to the top surface of UVLED 1, the sides of UVLED 1 are not coated, as total internal reflection at the interface of the side of the substrate and air may reflect radiation back into the UVLED where it may be extracted from the top surface. However, for manufacturing and/or reliability reasons, the sides of UVLED 1 may be coated, for example to protect the UVLED, or in order to use a method such as spin coating or dispensing that would necessarily coat both the top and side surfaces of UVLED 1.

Though a single UVLED 1 is illustrated in FIGS. 2, 3, and 4, in some embodiments multiple UVLEDs 1 are disposed in a single package. Optics corresponding to each UVLED may be provided, or optics corresponding to multiple UVLEDs may be provided. For example, though a single optic corresponding to a single UVLED 1 is illustrated in FIG. 4, in some embodiments, a single optic is optically coupled to more than one UVLED.

Having described the invention in detail, those skilled in the art will appreciate that, given the present disclosure, modifications may be made to the invention without departing from the spirit of the inventive concept described herein. In particular, different features and components of the different devices described herein may be used in any of the other devices, or features and components may be omitted from any of the devices. A characteristic of, for example, the optic, described in the context of one embodiment, may be applicable to any embodiment. Therefore, it is not intended that the scope of the invention be limited to the specific embodiments illustrated and described.

What is being claimed is:

1. A device comprising:
    a light emitting diode (LED) comprising a semiconductor structure comprising an active layer disposed between an n-type region and a p-type region, wherein the active layer emits ultraviolet radiation;
    a mount, wherein the LED is disposed on the mount;
    a support surrounding a conductive slug, the support comprising a thermally conductive pad disposed beneath the conductive slug, wherein the thermally conductive pad is not electrically connected to the LED;
    a lens disposed over the LED;
    a transparent first optical layer disposed directly between the LED and a bottom surface of the lens, and directly contacting the LED and the bottom surface of the lens; and
    a transparent adhesive layer directly contacting the LED and laterally encapsulating the LED, the adhesive layer also directly contacting the bottom surface of the lens and affixing the lens to the support, wherein the first optical layer is formed of a first material that is different from a second material forming the adhesive layer, and wherein light from a top surface and side surfaces of the LED is coupled into the bottom surface of the lens via the first optical layer and the adhesive layer;
    wherein the mount is disposed on the conductive slug.

2. The device of claim 1 further comprising a first metal layer in direct contact with the p-type region and a second metal layer in direct contact with the n-type region, wherein the first and second metal layers are both formed on a first side of the semiconductor structure.

3. The device of claim 1 wherein the adhesive layer is no more than 200 μm thick.

4. The device of claim 1 wherein the lens comprises a domed surface.

5. The device of claim 1 wherein the LED is electrically and mechanically connected to a top surface of the mount, wherein an entire bottom surface of the mount comprises a thermal path to the LED that is not electrically connected to the LED.

6. The device of claim 1 wherein the conductive slug is metal and the support is ceramic.

7. The device of claim 1 wherein the support is a reflector cup and the mount is disposed in a bottom of the reflector cup.

8. The device of claim 1 wherein the support comprises slanted sidewalls.

9. The device of claim 8 wherein the lens rests on the slanted sidewalls.

10. The device of claim 1 further comprising wire bonds disposed between a top surface of the mount and a top surface of the support, wherein a height of the wire bonds is less than a height of a top surface of the LED.

11. The device of claim 1 wherein the support further comprises:
    electrically conductive contact pads disposed on a bottom surface;
    electrically conductive pads disposed on a top surface; and
    vias formed within the support, the vias electrically connecting the electrically conductive pads disposed on the top surface with the electrically conductive contact pads disposed on the bottom surface.

12. The device of claim 11 further comprising a metal-core printed circuit board, wherein the electrically conductive contact pads are connected to contact pads on the metal-core printed circuit board, and the thermally conductive pad is connected to a thermal pad on the metal-core printed circuit board.

13. The device of claim 12 wherein the thermal pad on the metal-core printed circuit board comprises an exposed portion of the metal core.

14. The device of claim 12 wherein the metal-core printed circuit board is thermally connected to a heat sink.

15. The device of claim 11 further comprising a structure, wherein the electrically conductive contact pads are connected to contact pads on the structure, and the thermally conductive pad is connected to a thermal pad on the structure.

16. The device of claim 11 wherein the n-type region is electrically connected to one of the electrically conductive contact pads and the p-type region is electrically connected to another of the electrically conductive contact pads.

17. A device comprising:
    a light emitting diode (LED) comprising a semiconductor structure comprising an active layer disposed between an n-type region and a p-type region, wherein the active layer emits ultraviolet radiation;
    a mount, wherein the LED is disposed on the mount;

a support surrounding a conductive slug, the support comprising an insulating material, electrically conductive contact pads disposed on a bottom surface of the insulating material, and a thermally conductive pad disposed beneath the conductive slug, wherein the thermally conductive pad is not electrically connected to the LED;

a lens disposed over the LED;

a transparent first optical layer disposed directly between the LED and a bottom surface of the lens, and directly contacting the LED and the bottom surface of the lens; and a transparent adhesive layer directly contacting the LED and laterally encapsulating the LED, the adhesive layer also directly contacting the bottom surface of the lens and affixing the lens to the support, wherein the first optical layer is formed of a first material that is different from a second material forming the adhesive layer, and wherein light from a top surface and side surfaces of the LED is coupled into the bottom surface of the lens via the first optical layer and the adhesive layer;

wherein the mount is disposed on the conductive slug and the insulating material is shaped such that sidewalls facing the LED are slanted and form a reflector cup.

18. The device of claim 17 wherein the LED is electrically and mechanically connected to a top surface of the mount, wherein an entire bottom surface of the mount comprises a thermal path to the LED that is not electrically connected to the LED.

19. The device of claim 17 wherein the support is a reflector cup and the mount is disposed in a bottom of the reflector cup.

20. The device of claim 17 further comprising a metal-core printed circuit board, wherein the electrically conductive contact pads are connected to contact pads on the metal-core printed circuit board, and the thermally conductive pad is connected to a thermal pad on the metal-core printed circuit board.

* * * * *